US006559787B1

(12) United States Patent
Aude et al.

(10) Patent No.: US 6,559,787 B1
(45) Date of Patent: May 6, 2003

(54) APPARATUS FOR REDUCING CHARGE KICKBACK IN A DYNAMIC COMPARATOR

(75) Inventors: Arlo J. Aude, Atlanta, GA (US); Laurence D. Lewicki, Sunnyvale, CA (US); Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/911,233

(22) Filed: Jul. 23, 2001

(51) Int. Cl.[7] ................................................ H03M 1/38
(52) U.S. Cl. ....................................... 341/161; 341/156
(58) Field of Search .................................. 341/161, 156

(56) References Cited

U.S. PATENT DOCUMENTS 6,014,097 A * 1/2000 Brandt ........................ 341/156

* cited by examiner

Primary Examiner—Peguy Jeanpierre
Assistant Examiner—Joseph Lauture
(74) Attorney, Agent, or Firm—Davis Munck, P.C.

(57) ABSTRACT

There is disclosed a comparator comprising: 1) a first comparison circuit capable of receiving an input signal, wherein the first comparison circuit is enabled and compares the signal when a received LATCH signal is enabled and is disabled when the received LATCH signal is disabled; and 2) a second comparison circuit coupled to the input signal in parallel with the first comparison circuit, wherein an input stage of the second comparison circuit is substantially identical to an input stage of the first comparison circuit. The second comparison circuit is enabled and compares the input signal when the received LATCH is signal is disabled and is disabled when the received LATCH signal is enabled.

8 Claims, 4 Drawing Sheets

APPARATUS FOR REDUCING CHARGE KICKBACK IN A DYNAMIC COMPARATOR

TECHNICAL FIELD OF THE INVENTION

The present invention is generally directed to a comparator for use in an analog-to-digital converter (ADC) and, more specifically, to an apparatus for reducing charge kickback in a dynamic comparator.

BACKGROUND OF THE INVENTION

Many low-power, high-speed application make use of a pipelined analog-to-digital (A/D) converter (or ADC). Pipelined ADCs provide high data throughput rates, occupy a comparatively small area of an integrated circuit, consume relatively little power, and minimize circuit complexity. Many of these advantages stem from the pipelined arrangement of multiple small A/D conversion stages.

All of the stages work concurrently. The first stage converts the most recent analog sample to a small number of digital bits (e.g., 2 bits) and passes an analog residue signal on to a subsequent stage. Each of the subsequent stages converts the analog residue signal from a preceding stage to digital bits and passes its own analog residue signal to the next stage.

Each stage comprises a dynamic comparator that latches the analog residue signal of a preceding stage and compares it to a reference level voltage. When the LATCH control signal for the dynamic comparator is disabled, the common source node of the input metal-oxide silicon field effect transistors (MOSFETs) of the dynamic comparator is not biased. During this time, the input MOSFETs do not have a channel formed and hence have no channel charge. When the LATCH control signal is enabled, the common source node of the input MOSFETs is biased and current is forced through the sources of the input devices, thereby creating a channel. This action pulls channel charge into the gates. The driving amplifier connected to the dynamic comparator inputs must instantaneously supply this channel charge. This phenomenon is called kickback charge injection by those skilled in the art of ADC design. Depending on the type of input device used in the comparator, the output of the amplifier either has charge injected into it or charge extracted from it. This causes the amplifier output to either fall below or rise above the correct output voltage.

After some time, the amplifier output recovers and the output voltage stabilizes to the correct value. Unfortunately, by this time, the comparator has already made its decision. Therefore, the drop or rise induced by the comparator kickback is seen by the comparator circuit as an offset in the compare threshold.

Therefore, there is a need in the art for analog-to-digital converters that are not susceptible to the effects of kickback charge. More particularly, there is a need for a dynamic comparator that can sample an analog signal line while causing minimal charge kickback to an amplifier driving the signal line.

SUMMARY OF THE INVENTION

To address the above-discussed deficiencies of the prior art, it is a primary object of the present invention to provide, in an advantageous embodiment of the present invention, a comparator comprising: 1) a first comparison circuit capable of receiving an input signal, wherein the first comparison circuit is enabled and compares the signal when a received LATCH signal is enabled and is disabled when the received LATCH signal is disabled; and 2) a second comparison circuit coupled to the input signal in parallel with the first comparison circuit, wherein an input stage of the second comparison circuit is substantially identical to an input stage of the first comparison circuit and the second comparison circuit is enabled and compares the input signal when the received LATCH signal is disabled and is disabled when the received LATCH signal is enabled.

In one embodiment of the present invention, an input capacitance of the input stage of the second comparison circuit is substantially identical to an input capacitance of the input stage of the first comparison circuit.

In another embodiment of the present invention, the input stage of the second comparison circuit is a single-ended differential pair input stage substantially identical to a single ended differential pair input stage of the first comparison circuit.

In yet another embodiment of the present invention, an input capacitance of the single-ended differential pair input stage of the second comparison circuit is substantially identical to an input capacitance of the single-ended differential pair input stage of the first comparison circuit.

It is another primary object of the present invention to provide, for use in an analog-to-digital (ADC) converter, an ADC stage capable of receiving a differential analog input signal, quantizing the differential analog input signal to a plurality of digital bits, and generating an output residue signal corresponding to a quantization error of the differential analog input signal. According to an exemplary embodiment of the present invention, the ADC stage comprises: 1) a first comparator coupled to the differential analog input signal, wherein the first comparator is enabled and compares the differential analog input signal when a received LATCH signal is enabled and is disabled when the received LATCH signal is disabled; and 2) a second comparator coupled to the differential analog input signal in parallel with the first comparator. An input stage of the second comparator is substantially identical to an input stage of the first comparator and the second comparator is enabled and compares the differential analog input signal when the received LATCH signal is disabled and is disabled when the received LATCH signal is enabled.

According to one embodiment of the present invention, an input capacitance of the input stage of the second comparator is substantially identical to an input capacitance of the input stage of the first comparator.

According to another embodiment of the present invention, the input stage of the second comparator is a differential pair input stage substantially identical to a differential pair input stage of the first comparator.

According to still another embodiment of the present invention, an input capacitance of the differential pair input stage of the second comparator is substantially identical to an input capacitance of the differential pair input stage of the first comparator.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged pipelined analog-to-digital converter (ADC) architecture.

Figure 1:
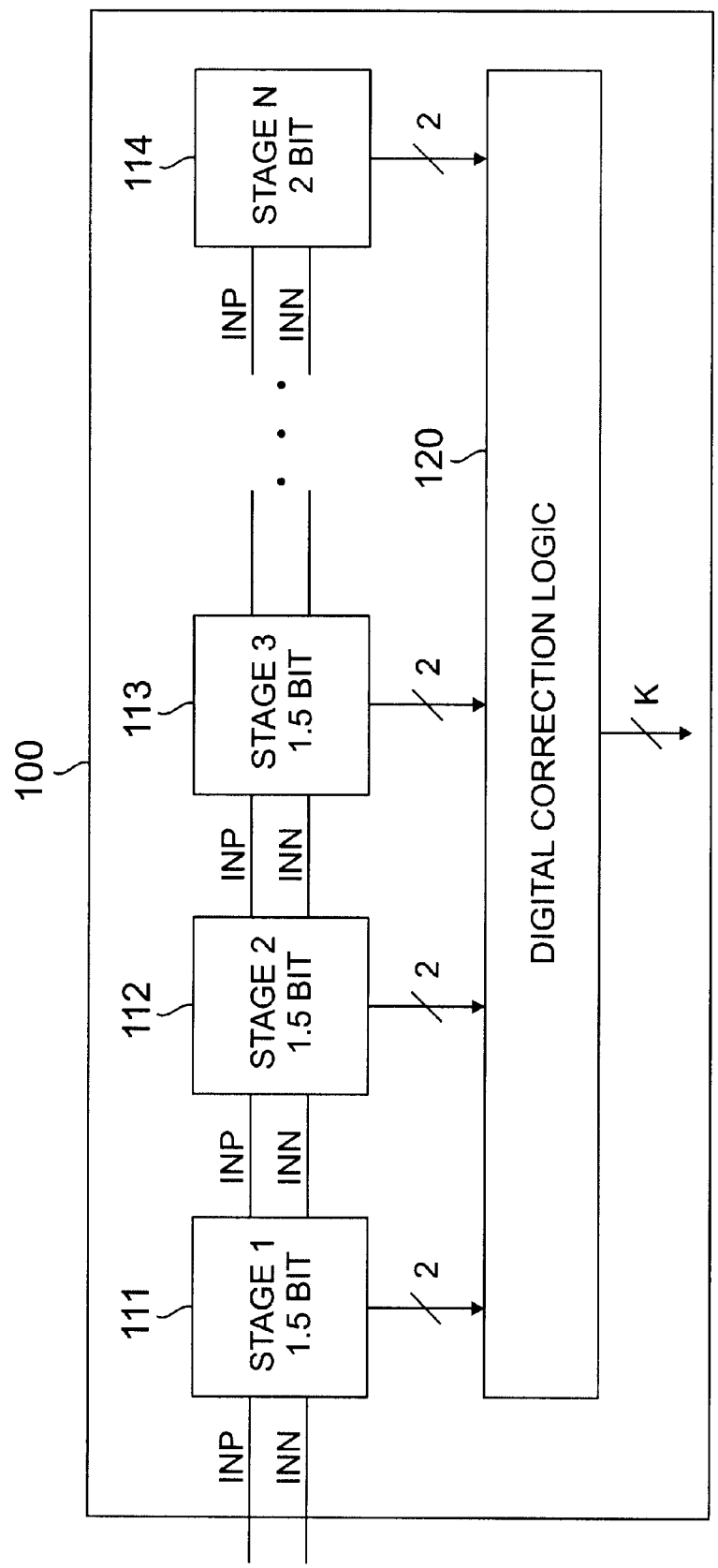
FIG. 1 illustrates an exemplary pipelined analog-to-digital converter (ADC) according to one embodiment of the present invention.

FIG. 1 illustrates exemplary pipelined analog-to-digital converter (ADC) 100 according to one embodiment of the present invention. Pipelined ADC 100 comprises N exemplary ADC stages 111–114, sequentially labeled Stage 1, Stage 2, Stage 3 and Stage N. The first N-1 stages (including ADC stages 111–113) are 1.5 bit ADC stages and the last stage (ADC stage 114) is a 2-bit ADC stage. ADC stage 111 receives a differential analog input signal comprising a positive differential input (INP) and a negative differential input (INN). ADC stage 111 converts the differential input signal to a 1.5 bit digital output signal, calculates the quantization error, and converts the quantization error to a differential analog output residue signal. The 1.5 bit digital output signal is transmitted as two digital bits to digital correction logic 120.

Except for ADC stage 114, every subsequent ADC stage receives the differential analog output residue signal from the preceding ADC stage as its own differential input (INP, INN), converts the differential input signal to a 1.5 bit digital output signal that is transmitted as two digital bits to digital correction logic 120. Each subsequent ADC stage also calculates the quantization error and converts the quantization error to a differential analog output residue signal. Digital correction logic 120 removes a redundancy in each stage bit resolution that partially contributes to the K-bit digital output signal according to algorithms well-known to those skilled in the art.

Each ADC stage comprises a dynamic comparator that latches the differential input, INP and INN. When latched, the dynamic comparator causes the driving amplifier of the preceding ADC stage to charge to source capacitance the gates of the input is devices coupled to INP and INN. As noted in the Background, this phenomenon is called kickback charge injection. Depending on the type of input device used in the comparator, the output of the amplifier either has charge injected into it or charge extracted from it. This causes the amplifier output to either fall below or rise above the correct output voltage. After some time, the amplifier output drives the output voltage back to the correct level.

Figure 2A:
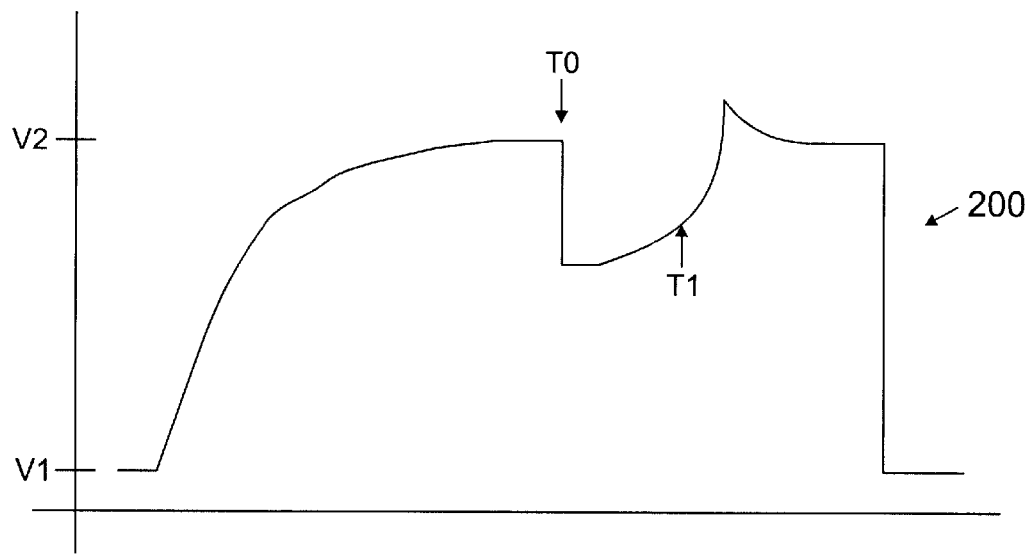
FIG. 2A illustrates the effect of kickback charge injection in a comparator in accordance with the prior art.

FIG. 2A illustrates the effect of kickback charge injection in a comparator in accordance with the prior art. Output waveform 200 is produced by an output amplifier of a preceding ADC stage coupled to a conventional comparator in a subsequent ADC stage. Output waveform 200 is initially at voltage level V1. At some point, the preceding ADC stage evaluates its input and the output amplifier of the preceding stage drives an output line, such as INN or INP, to voltage level V2. When the input is stable, the comparator is latched at time T0. Latching turns on a differential pair input stage of the comparator. When the differential pair turns on, the effective capacitance of the input transistors coupled to INN and INP changes and the amplifier output drops or rises accordingly. In FIG. 2, the amplifier output drops at T0. Thereafter, the output amplifier of the preceding stage charges back up to voltage level V2. Unfortunately, the comparator may evaluate at time T1, before the output amplifier has charged back up to voltage level V2. This causes an inaccurate comparison.

Figure 3:
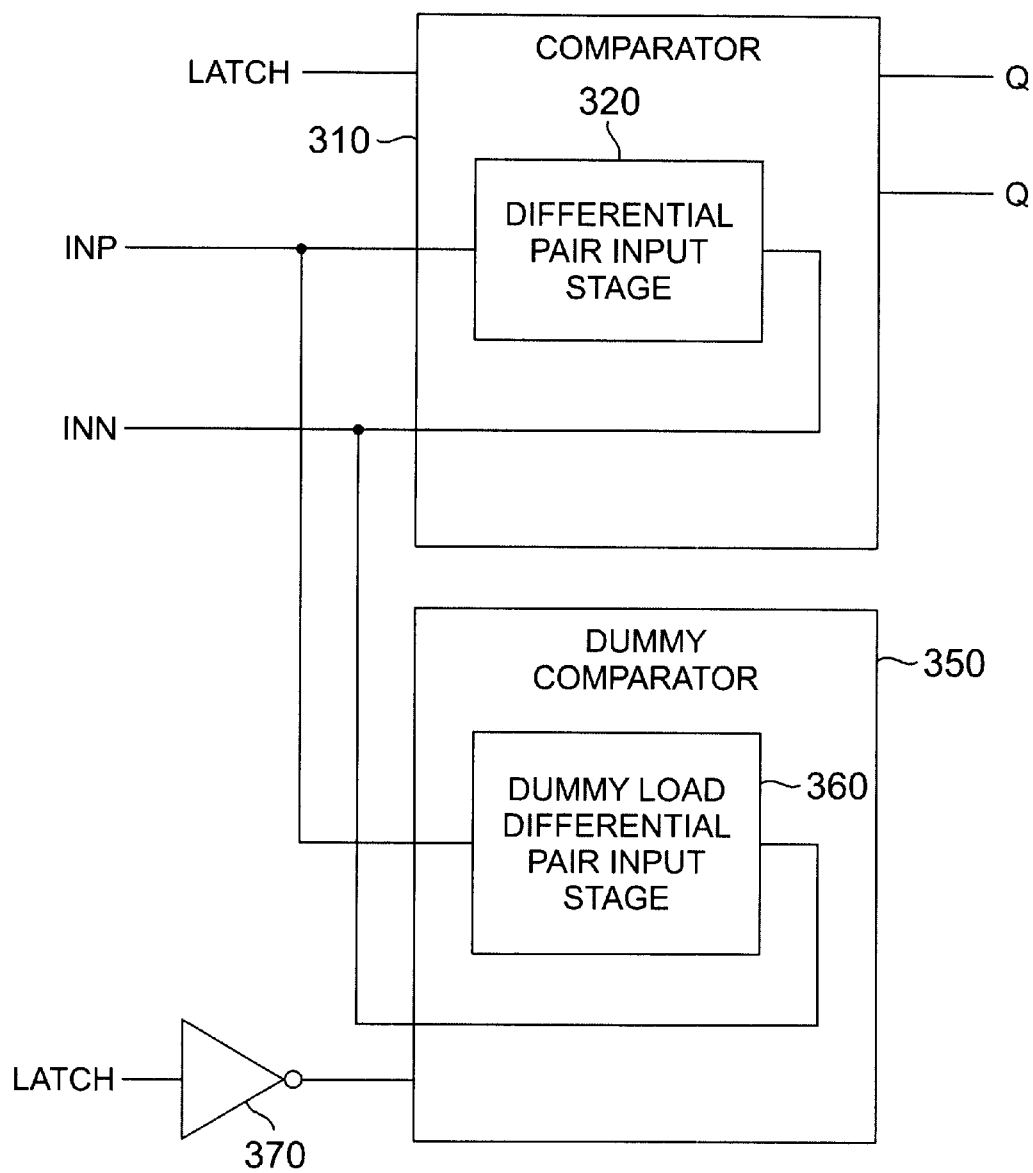
FIG. 3 illustrates an exemplary dummy comparator coupled to the input lines INN and INP in parallel with an exemplary real comparator according to the principles of the present invention.

To overcome this problem, the present invention uses a dummy comparator coupled to the driving amplifier in parallel with the real comparator. FIG. 3 illustrates exemplary dummy comparator 350 coupled to the input lines INN and INP in parallel with exemplary real comparator 310 according to the principles of the present invention. Dummy comparator 350 is the exact same size and makeup as real comparator 310, but is latched by inverter 370 in opposite phase to real comparator 310.

Real comparator 310 comprises differential pair input stage 320, which receives the signals INP and INN from the preceding ADC stage. Real comparator 310 evaluates INP and INN and produces the outputs Q and Q'. Similarly, dummy comparator 350 comprises dummy load differential pair input stage 360, which matches differential pair input stage 320 and receives the signals INP and INN from the preceding ADC stage. When dummy comparator 350 turns OFF and real comparator 310 turns ON, the charge stored in the input transistors of dummy load differential pair input stage 360 is injected into the amplifier output of the previous stage to cancel the charge required by differential input stage 320 of real comparator.

Figure 2B:
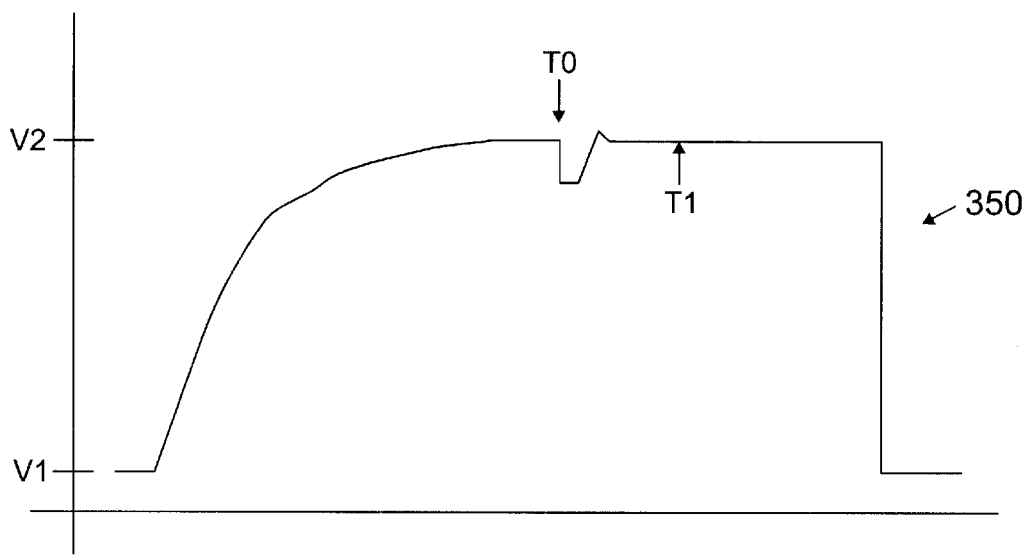
FIG. 2B illustrates the negation of the kickback charge injection effect in a comparator in accordance with the principles of the present invention.

FIG. 2B illustrates the negation of the kickback charge injection effect in a comparator in accordance with the principles of the present invention. Output waveform 250 is produced by an output amplifier of a preceding ADC stage coupled to a comparator according to the principles of the present invention in a subsequent ADC stage. When the dummy comparator turns OFF and the real comparator turns ON at time T0, the voltage level of the output amplifier of the preceding ADC stage drops below V2, as before in FIG. 2A. However, the charge stored in the input transistors of dummy load differential pair input stage is injected into the amplifier output of the previous stage to cancel the charge required by the differential input stage of the real comparator. As a result, the voltage level of the output amplifier of the preceding ADC stage returns to V2 much more rapidly. As a result, when the comparator latches at T1 and evaluates the input, the voltage level of the output amplifier is at the correct V2 level.

Figure 4:
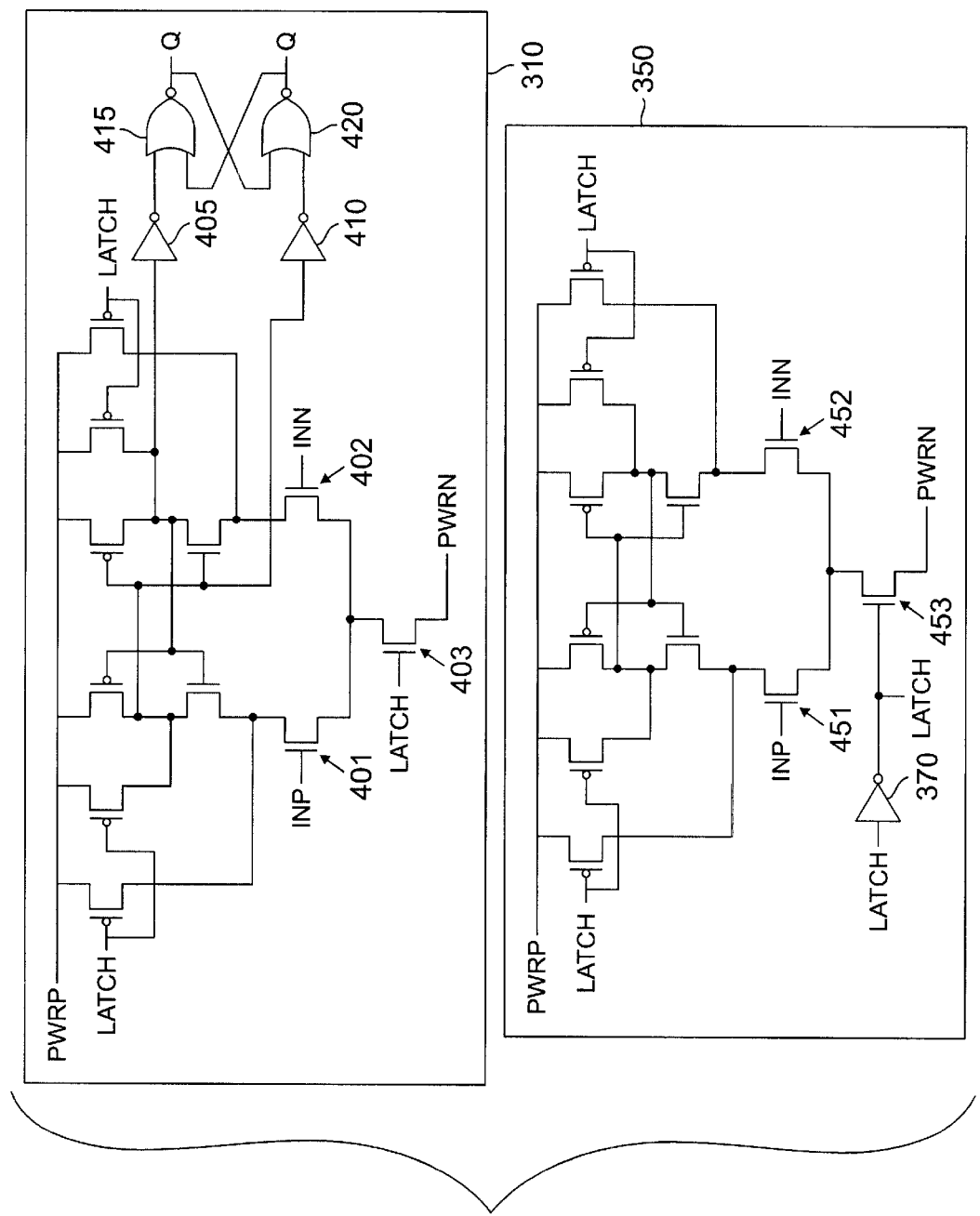
FIG. 4 illustrates the exemplary dummy comparator and the exemplary real comparator in greater detail according to one embodiment of the present invention.

FIG. 4 illustrates exemplary dummy comparator 350 and exemplary real comparator 310 in greater detail according to one embodiment of the present invention. Comparator 310 comprises a differential input stage comprising N-type transistors 401 and 402. The gate of transistor 401 receives the input signal INP and the gate of transistor 402 receives the input signal INN. The source of transistor 401 and the source of transistor 402 are coupled to the drain of N-type transistor 403. The gate of transistor 403 receives the enabling signal LATCH. When the LATCH signal is low, (i.e., Logic 0), transistor 403 is OFF and no drain-to-source current flows in transistors 401 and 402. In this state, the gate-to-source capacitance of transistor 401 is C401(OFF) and the gate-to-source capacitance of transistor 402 is C402(OFF).

When the LATCH signal goes high (i.e., Logic 1), transistor 403 is ON and the sources of transistors 401 and 402 are connected to the negative (or ground) power supply rail (PWRN). Thus, drain-to-source current flows in both transistor 401 and transistor 402. In this state, comparator 310 is turned ON and latches the signals INN and INP. However, the drain-to-source current flows in transistors 401 and 402 changes the gate-to-source capacitance of transistors 401 and 402. When comparator 310 is ON, the gate-to-source capacitance of transistor 401 is C401(ON) and the gate-to-source capacitance of transistor 402 is C402(ON).

The remaining N-type and P-type transistors between the drains of transistors 401 and 402 and the positive power supply rail (PWRP) perform the comparison and drive inverters 405 and 410 and NOR gates 415 and 420. The logic bits Q and Q' produced by NOR gates 415 and 420 indicate the state of INP and INN and are used by other circuits in each ADC stage. Additional details regarding the exact operation of the remaining transistors in comparator 310 are unnecessary to an understanding of the operation of the present invention and are therefore omitted.

As noted above, when the LATCH signal is switched ON, the gate-to-source capacitance of transistor 401 suddenly changes from C401(OFF) to C401(ON). Similarly, the gate-to-source capacitance of transistor 402 suddenly changes from C402(OFF) to C402(ON). This causes the sudden dip below voltage level V2 that occurs at time T0 in FIG. 2. Dummy comparator 310 combats this effect.

Dummy comparator 350 also comprises a differential input stage comprising N-type transistors 451 and 452. The gate of transistor 451 receives the input signal INP and the gate of transistor 452 receives the input signal INN. The source of transistor 451 and the source of transistor 452 are coupled to the drain of N-type transistor 453. However, dummy comparator 350 works in opposite phase to real comparator 310.

The input of inverter 370 receives the LATCH signal and produces the LATCH' signal. The gate of transistor 453 receives the enabling signal, LATCH'. When the LATCH signal is high, the LATCH' signal is low, (i.e., Logic 0), transistor 453 is OFF and no drain-to-source current flows in transistors 451 and 452. In this state, the gate-to-source capacitance of transistor 451 is C451(OFF) and the gate-to-source capacitance of transistor 452 is C452(OFF).

When the LATCH signal is low, the LATCH' signal is high (i.e., Logic 1), the sources of transistors 451 and 452 are connected to the negative (or ground) power supply rail (PWRN). In this state, dummy comparator 350 is turned ON and latches the signals INN and INP. However, the drain-to-source current flows in transistors 451 and 452 changes the gate-to-source capacitance of transistors 451 and 452. When comparator 350 is ON, the gate-to-source capacitance of transistor 451 is C451(ON) and the gate-to-source capacitance of transistor 452 is C452(ON). The remaining N-type and P-type transistors between the drains of transistors 451 and 452 and the positive power supply rail (PWRP) operate the same as in real comparator 310.

Since the input transistors in dummy comparator 350 are identical to the input transistors of real comparator 310, the input capacitances on the INN and INP signal lines are identical. Since either dummy comparator 350 or real comparator 310 is always ON, the output amplifier of the preceding stage that is driving the signal lines INN and INP always sees the same load capacitance, except for a brief instant when the LATCH signal is changing states from ON to OFF and vice versa. As a result, the drop seen on the input lines at time T0 is very brief, as shown in FIG. 3. Thus, real comparator 310 may sample at time T1 in FIG. 3 and get a more accurate reading of the values of INN and INP.

Those skilled in the art will recognize that the circuits illustrated in FIG. 4 for real comparator 310 and dummy comparator 350 are exemplary only. It should be understood that many different types of comparator architectures may readily be used in alternate embodiments of the present invention. By way of example, in one alternate embodiment, bi-polar junction transistors (BJT) may be used to implement the comparators. In other alternate embodiments, transistor 403 may be replaced by a first transistor coupled to the drain of transistor 401 and a second transistor coupled to the drain of transistor 402. These replacement transistors would be driven by the LATCH signal in order to enable or disable drain-to-source currents in transistors 401 and 402. In still other alternate embodiments, comparators 310 and 350 may be single input devices in which the differential pair input stage is single-ended (i.e., INN is grounded).

Although the present invention has been described in detail, those skilled in the art should understand that they can make various changes, substitutions and alterations herein without departing from the spirit and scope of the invention in its broadest form.

What is claimed is:
1. For use in an analog-to-digital converter (ADC), an ADC stage capable of receiving a differential analog input signal, quantizing said differential analog input signal to a plurality of digital bits, and generating an output residue signal corresponding to a quantization error of said differential analog input signal, said ADC stage comprising:

a first comparator coupled to said differential analog input signal, wherein said first comparator is enabled and compares a first differential input and a second differential input of said differential analog input signal when a received LATCH signal is enabled and is disabled when said received LATCH signal is disabled; and a second comparator coupled to said differential analog input signal in parallel with said first comparator, wherein an input stage of said second comparator is substantially identical to an input stage of said first comparator and said second comparator is enabled and compares said first differential input and said second differential input of said differential analog input signal when said received LATCH signal is disabled and is disabled when said received LATCH signal is enabled.

2. The ADC stage as set forth in claim 1 wherein an input capacitance of said input stage of said second comparator is substantially identical to an input capacitance of said input stage of said first comparator.

3. The ADC stage as set forth in claim 1 wherein said input stage of said second comparator is a differential pair input stage substantially identical to a differential pair input stage of said first comparator.

4. The ADC stage as set forth in claim 3 wherein an input capacitance of said differential pair input stage of said second comparator is substantially identical to an input capacitance of said differential pair input stage of said first comparator.

5. A comparator comprising:

a first comparison circuit capable of receiving a differential input signal, wherein said first comparison circuit is enabled and compares said a first differential input and a second differential input of said differential input signal when a received LATCH signal is enabled and is disabled when said received LATCH signal is disabled; and a second comparison circuit coupled to said differential input signal in parallel with said first comparison circuit, wherein an input stage of said second comparison circuit is substantially identical to an input stage of said first comparison circuit and said second comparison circuit is enabled and compares said first differential input and said second differential input of said differential input signal when said received LATCH signal is disabled and is disabled when said received LATCH signal is enabled.

6. The comparator as set forth in claim 5 wherein an input capacitance of said input stage of said second comparison circuit is substantially identical to an input capacitance of said input stage of said first comparison circuit.

7. The comparator as set forth in claim 5 wherein said input stage of said second comparison circuit is a single-ended differential pair input stage substantially identical to a single ended differential pair input stage of said first comparison circuit.

8. The comparator as set forth in claim 7 wherein an input capacitance of said single-ended differential pair input stage of said second comparison circuit is substantially identical to an input capacitance of said single-ended differential pair input stage of said first comparison circuit.

* * * * *

UNITED STATES PATENT AND TRADEMARK OFFICE
CERTIFICATE OF CORRECTION

PATENT NO. : 6,559,787 B1
DATED : May 6, 2003
INVENTOR(S) : Arlo J. Aude, Laurence D. Lewicki and Jitendra Mohan It is certified that error appears in the above-identified patent and that said Letters Patent is hereby corrected as shown below:

Column 4,
Line 26, delete "is" after "input".

Signed and Sealed this

Seventeenth Day of January, 2006

JON W. DUDAS
*Director of the United States Patent and Trademark Office*